(12) United States Patent
Matsuo et al.

(10) Patent No.: US 9,633,741 B1
(45) Date of Patent: Apr. 25, 2017

(54) SEMICONDUCTOR MEMORY DEVICE

(71) Applicant: Kabushiki Kaisha Toshiba, Minato-ku (JP)

(72) Inventors: Michiaki Matsuo, Nagoya (JP); Kenji Sawamura, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/269,251

(22) Filed: Sep. 19, 2016

Related U.S. Application Data

(60) Provisional application No. 62/312,148, filed on Mar. 23, 2016.

(51) Int. Cl.
    *G11C 16/26* (2006.01)
    *H01L 27/1157* (2017.01)
    (Continued)

(52) U.S. Cl.
    CPC .............. *G11C 16/26* (2013.01); *G11C 16/24* (2013.01); *G11C 16/34* (2013.01); *H01L 23/528* (2013.01);
    (Continued)

(58) Field of Classification Search
    CPC .... G11C 16/0483; G11C 16/10; H01L 27/115
    (Continued)

(56) References Cited

U.S. PATENT DOCUMENTS 7,983,084 B2   7/2011  Tokiwa et al.
8,848,440 B2   9/2014  Yasuda et al.
(Continued)

FOREIGN PATENT DOCUMENTS

JP   2010-102755   5/2010
JP   2013-196743   9/2013
JP   2014-26695    2/2014

*Primary Examiner* — Jason Lappas
(74) *Attorney, Agent, or Firm* — Oblon, McClelland, Maier & Neustadt, L.L.P.

(57) ABSTRACT

An embodiment comprises: a plurality of stacked bodies, each of the stacked bodies including a plurality of control gate electrodes stacked in a first direction, the stacked bodies extending in a second direction intersecting the first direction; an insulating isolation layer disposed between a pair of the stacked bodies adjacent in a third direction intersecting the first direction and the second direction, the insulating isolation layer extending in the second direction; a plurality of semiconductor layers, each of the semiconductor layers extending in the first direction and having its side surface covered by the plurality of control gate electrodes, the semiconductor layers being disposed in a plurality of columns in one of the plurality of stacked bodies; a memory cell disposed between the control gate electrode and the semiconductor layer, the memory cell including a charge accumulation layer; a plurality of bit lines each connected to one end of the semiconductor layer, the bit lines extending in the third direction; and a control circuit being configured to control the control gate electrode and the bit line. The control circuit, during a read operation, applies a first voltage to a first bit line connected to the semiconductor layer positioned in a first column of the plurality of columns, thereby reading a first one of the memory cells connected to the first bit line, and applies a second voltage different from the first voltage to a second bit line connected to the semiconductor layer positioned in a second column which is at a position more distant from the insulating isolation layer than the first column is, thereby reading a second one of the memory cells connected to the second bit line.

9 Claims, 10 Drawing Sheets

(51) Int. Cl.
*H01L 27/11582* (2017.01)
*H01L 27/11573* (2017.01)
*H01L 23/522* (2006.01)
*H01L 23/528* (2006.01)
*G11C 16/34* (2006.01)
*G11C 16/24* (2006.01)
G11C 16/04 (2006.01)
G11C 16/10 (2006.01)

(52) U.S. Cl.
CPC ...... *H01L 23/5226* (2013.01); *H01L 27/1157* (2013.01); *H01L 27/11573* (2013.01); *H01L 27/11582* (2013.01); *G11C 16/0483* (2013.01); *G11C 16/10* (2013.01)

(58) Field of Classification Search
USPC .......................... 365/185.17, 185.14, 185.28
See application file for complete search history.

(56) References Cited

U.S. PATENT DOCUMENTS

| | | |
|---|---|---|
| 8,995,185 B2 | 3/2015 | Hosono et al. |
| 2010/0238732 A1* | 9/2010 | Hishida .............. G11C 16/0483 365/185.17 |

* cited by examiner

Waveform of Node SEN

Waveform of Node SEN

SEMICONDUCTOR MEMORY DEVICE

CROSS REFERENCE TO RELATED APPLICATION

This application is based upon and claims the benefit of priority from U.S. Provisional Patent Application No. 62/312,148, filed on Mar. 23, 2016, the entire contents of which are incorporated herein by reference.

FIELD

Embodiments described herein relate to a semiconductor memory device.

BACKGROUND

A flash memory that stores data by accumulating a charge in a charge accumulation layer or floating gate, is known. Such a flash memory is connected by a variety of systems, such as NAND type or NOR type, and configures a semiconductor memory device. In recent years, increasing of capacity and raising of integration level of such a semiconductor memory device have been proceeding. Moreover, a semiconductor memory device in which memory cells are disposed three-dimensionally (a three-dimensional type semiconductor memory device) has been proposed to raise the integration level of the memory.

DETAILED DESCRIPTION

Figure 1:
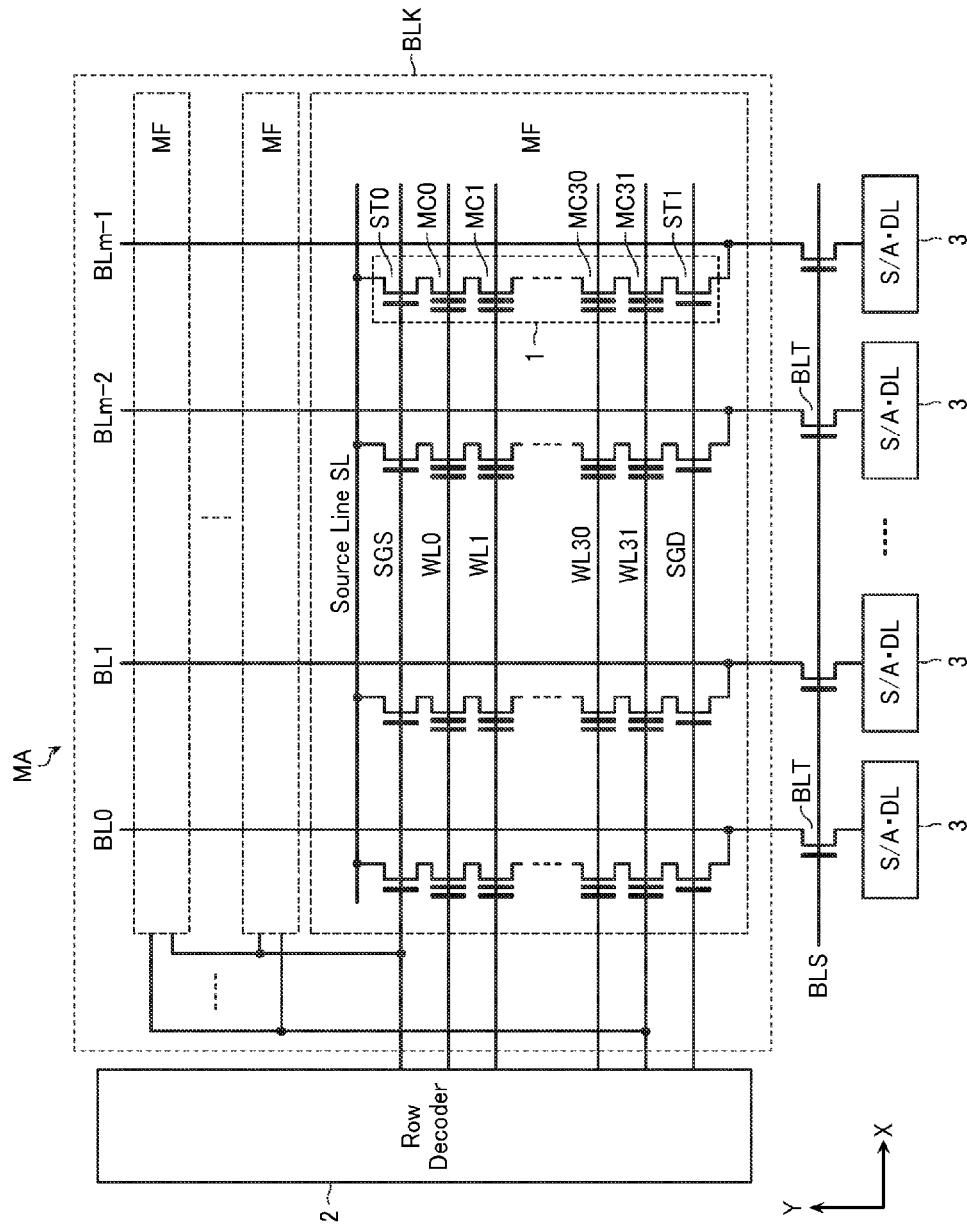
FIG. 1 is an equivalent circuit diagram showing a read circuit of a semiconductor memory device according to a first embodiment.

A semiconductor memory device according to an embodiment comprises: a plurality of stacked bodies, each of the stacked bodies including a plurality of control gate electrodes stacked in a first direction, the stacked bodies extending in a second direction intersecting the first direction; an insulating isolation layer disposed between a pair of the stacked bodies adjacent in a third direction intersecting the first direction and the second direction, the insulating isolation layer extending in the second direction; a plurality of semiconductor layers, each of the semiconductor layers extending in the first direction and having its side surface covered by the plurality of control gate electrodes, the semiconductor layers being disposed in a plurality of columns in one of the plurality of stacked bodies; a memory cell disposed between the control gate electrode and the semiconductor layer, the memory cell including a charge accumulation layer; a plurality of bit lines each connected to one end of the semiconductor layer, the bit lines extending in the third direction; and a control circuit being configured to control the control gate electrode and the bit line. The control circuit, during a read operation, applies a first voltage to a first bit line connected to the semiconductor layer positioned in a first column of the plurality of columns, thereby reading a first one of the memory cells connected to the first bit line, and applies a second voltage different from the first voltage to a second bit line connected to the semiconductor layer positioned in a second column which is at a position more distant from the insulating isolation layer than the first column is, thereby reading a second one of the memory cells connected to the second bit line.

First Embodiment

Next, semiconductor memory devices according to embodiments will be described in detail with reference to the drawings. Note that these embodiments are merely examples. For example, the semiconductor memory devices described below have a structure in which a memory string extends linearly in a direction intersecting a substrate surface. However, a similar structure may be applied also to a U-shaped structure in which the memory string is doubled back on an opposite side midway. Moreover, each of the drawings of the semiconductor memory devices employed in the embodiments below is schematic, and thicknesses, widths, ratios, and so on, of layers are not necessarily identical to those of the actual semiconductor memory devices.

Moreover, the embodiments below relate to semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to the substrate; and a gate electrode film provided, via a charge accumulation layer, on a side surface of the semiconductor film. However, it is also possible to adopt a memory cell of another form, for example, a SONOS (Semiconductor-Oxide-Nitride-Oxide-Semiconductor) type memory cell or MANOS (Metal-Aluminum Oxide-Nitride-Oxide-Semiconductor) type memory cell, a memory cell employing hafnium oxide ($HfO_x$) or tantalum oxide ($TaO_x$) as an insulating layer, or a floating gate type memory cell.

FIG. 1 is a view showing a memory cell array and a read circuit of a semiconductor memory device according to the present embodiment. A NAND string 1 of the semiconductor memory device includes: a source side select gate transistor ST0 and a drain side select gate transistor ST1; and a plurality of memory cells MC0 to MC31 connected in series between the select gate transistors ST0 and ST1. In the NAND string 1, a source/drain region is shared by adjacent fellow memory cells MC of the plurality of memory cells MC.

The memory cell MC is assumed to include an N type source/drain region formed in a P type well of a silicon substrate, and to be of a stacked gate structure having a control gate and a floating gate, the floating gate acting as a charge accumulation layer. The semiconductor memory device changes a charge amount stored in this floating gate by a write operation and an erase operation. As a result, a threshold voltage of the memory cell MC is changed, whereby data of one bit or multiple bits is stored in one memory cell MC.

The control gates of the pluralities of memory cells MC arranged in an X direction in FIG. 1 are commonly connected by word lines WL0 to WL31. In addition, the control gates of the plurality of source side select gate transistors ST0 are commonly connected by a source side select gate line SGS. Moreover, the control gates of the plurality of drain side select gate transistors ST1 are commonly connected by a drain side select gate line SGD. In the semiconductor memory device, a set of the plurality of NAND strings 1 sharing the word lines WL configures a memory finger MF. A block BLK is configured by the plurality of memory fingers MF sharing the word lines WL. A memory cell array MA is configured by a plurality of blocks (for example one block) BLK0, BLK1, . . . , BLK1-1.

The drain side select gate transistor ST1 is connected to a bit line BL. Moreover, the source side select gate transistor ST0 is connected to a source line SL. Disposed on a side of one end of each of the bit lines BL is a sense amplifier-cum-data latch 3 including a sense amplifier S/A and a data latch DL which are made use of in a read operation of data of the memory cell MC. Moreover, disposed on a side of one ends of the word lines WL is a row decoder 2 that performs selective drive of the word lines WL and the select gate lines SGS and SGD.

These row decoder 2 and sense amplifier-cum-data latch 3 configure part of the read circuit.

Now, m bit lines BL are disposed in one memory finger MF. The bit line BL and the sense amplifier-cum-data latch 3 are connected via a bit line select transistor BLT. The bit line select transistor BLT is on/off-controlled by a bit line select line BLS. When the bit line select transistor BLT is made conductive by the bit line select line BLS, bit lines BL0 to BLm−1 are selectively driven by the sense amplifier-cum-data latch 3.

Figure 2:
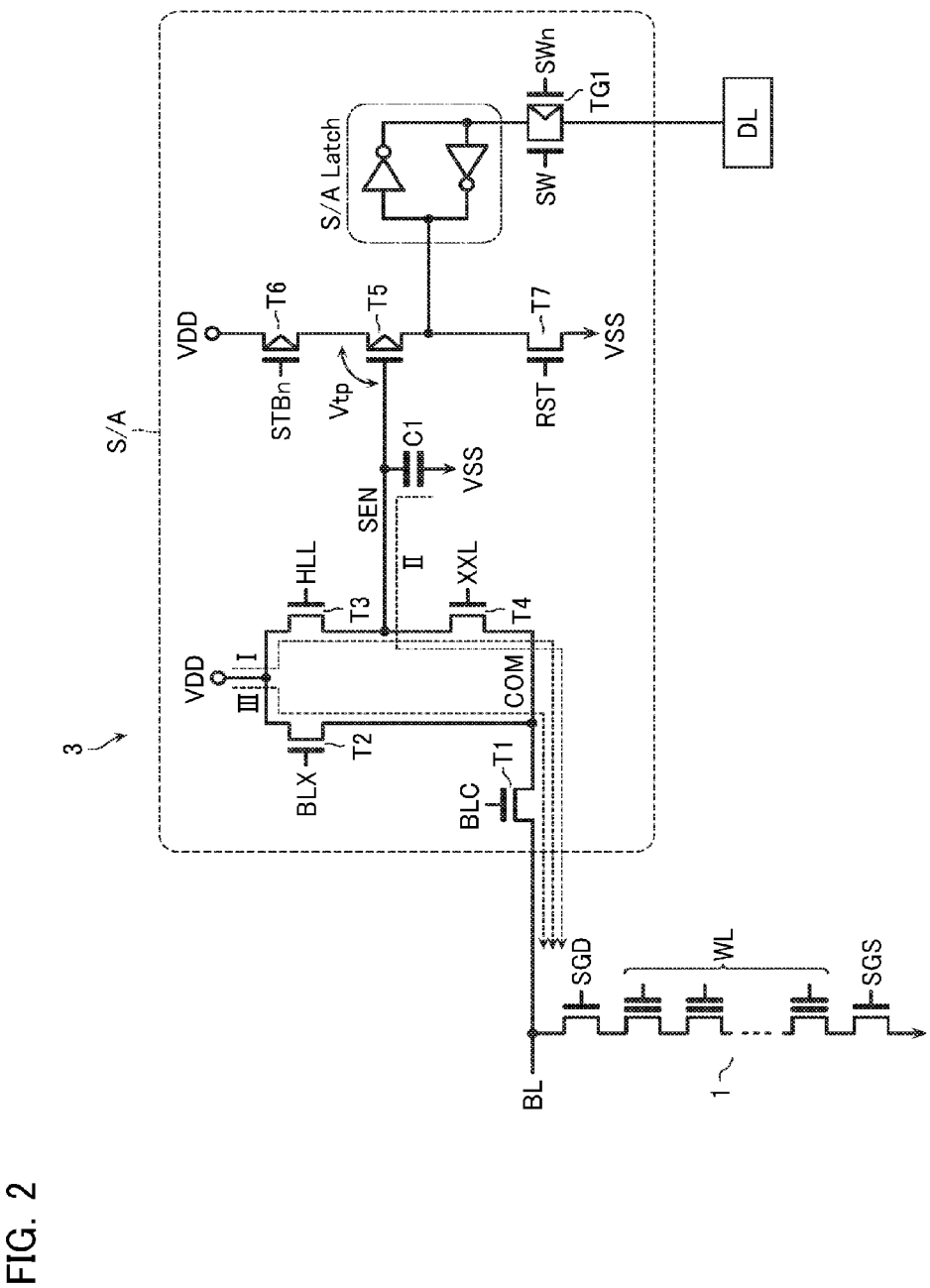
FIG. 2 is an equivalent circuit diagram showing an example of circuit configuration of a sense amplifier-cum-data latch 3 which is part of the read circuit.

FIG. 2 is a view showing an example of circuit configuration of the sense amplifier-cum-data latch 3 which is part of the read circuit.

The sense amplifier-cum-data latch 3 is configured from: the sense amplifier S/A connected to the bit line BL; and the data latch DL that stores a sense result of this sense amplifier S/A.

The sense amplifier S/A includes: a clamping-dedicated NMOS transistor T1 connected between a node COM and the bit line BL and having its gate supplied with a control voltage BLC; a continuous current supply-dedicated NMOS transistor T2 connected between a power supply terminal VDD and the node COM and having its gate supplied with a control voltage BLX; a pre-charging-dedicated NMOS transistor T3 connected between the power supply terminal VDD and a detection node SEN and having its gate supplied with a control voltage HLL; a charge transfer-dedicated NMOS transistor T4 connected between the detection node SEN and the node COM and having its gate supplied with a control voltage XXL; a capacitor C1 connected between the detection node SEN and a ground terminal VSS; a PMOS transistor T5 having the detection node SEN connected to its gate; a PMOS transistor T6 connected between the power supply terminal VDD and a drain of the transistor T5 and having its gate supplied with a strobe signal STBn; an NMOS transistor T7 connected between a source of the transistor T5 and the ground terminal VSS and having its gate supplied with a control voltage RST; a sense amplifier latch configured from two inverters and having one of its inputs connected to a node between the transistor T5 and the transistor T7; and a transfer gate TG1 connected between the other of the inputs of the sense amplifier latch and the data latch DL and controlled by signals SW and SWn. This sense amplifier S/A is an ABL (All Bit Line) system sense amplifier.

Next, operation of the sense amplifier-cum-data latch 3 will be described. It should be noted that numerical values below are merely an example to facilitate understanding.

First, assuming a threshold value of the NMOS transistor to be VthN, the control voltage of the pre-charging-dedicated NMOS transistor T3 is set to HLL=VDD+VthN, the control voltage of the continuous current supply-dedicated NMOS transistor T2 is set to BLX=0.7 V+VthN, the control voltage of the charge transfer-dedicated NMOS transistor T4 is set to XXL=0.9 V+VthN, and the control voltage of the clamping-dedicated NMOS transistor T1 is set to BLC=0.5 V+VthN. As a result, the detection node SEN is pre-charged to a power supply voltage VDD.

Moreover, because the control voltage BLX=0.7 V+VthN, the control voltage XXL=0.9 V+VthN, and the control voltage BLC=0.5 V+VthN, the bit line BL is charged to a maximum of about 0.5 V and attains a steady state.

A current path of a current flowing to the bit line BL in this state is I in FIG. 2. At a time point when a level of the bit line BL has attained the steady state, the control voltage HLL is set to HLL=0 V, whereby charging to the capacitor C1 connected to the detection node SEN is stopped.

As a result, the current path of the current flowing to the bit line BL becomes II in FIG. 2. By a relationship of XXL>BLX, charge is transferred preferentially from the capacitor C1 of the detection node SEN to the bit line BL. A voltage of the detection node SEN changes according to a cell current. Moreover, at a time point when a level of the detection node SEN has fallen and reached 0.7 V, the control voltage BLX is BLX=0.7V+VthN, hence thereafter, the current ends up being supplied to the bit line BL via the transistor T2. The current path of the current flowing to the bit line BL at this time is III in FIG. 2. As a result, the level of the bit line BL is maintained.

After a certain time has passed, the level of the detection node SEN attains a level determined by the cell current, hence this is discriminated by a discriminating circuit configured from the transistors T5 to T7 and held in the sense amplifier latch (S/A Latch). Moreover, when a result of this sense amplifier latch is valid, the transfer gate TG1 is set to on by the signals SW and SWn, and the level of the detection node SEN is downloaded to the data latch DL.

As described above, in the sense amplifier in the present embodiment, a change in the level of the detection node SEN is detected. Moreover, the level of the bit line BL does not necessarily change, regardless of on/off of the data read target memory cell MC.

Figure 3:
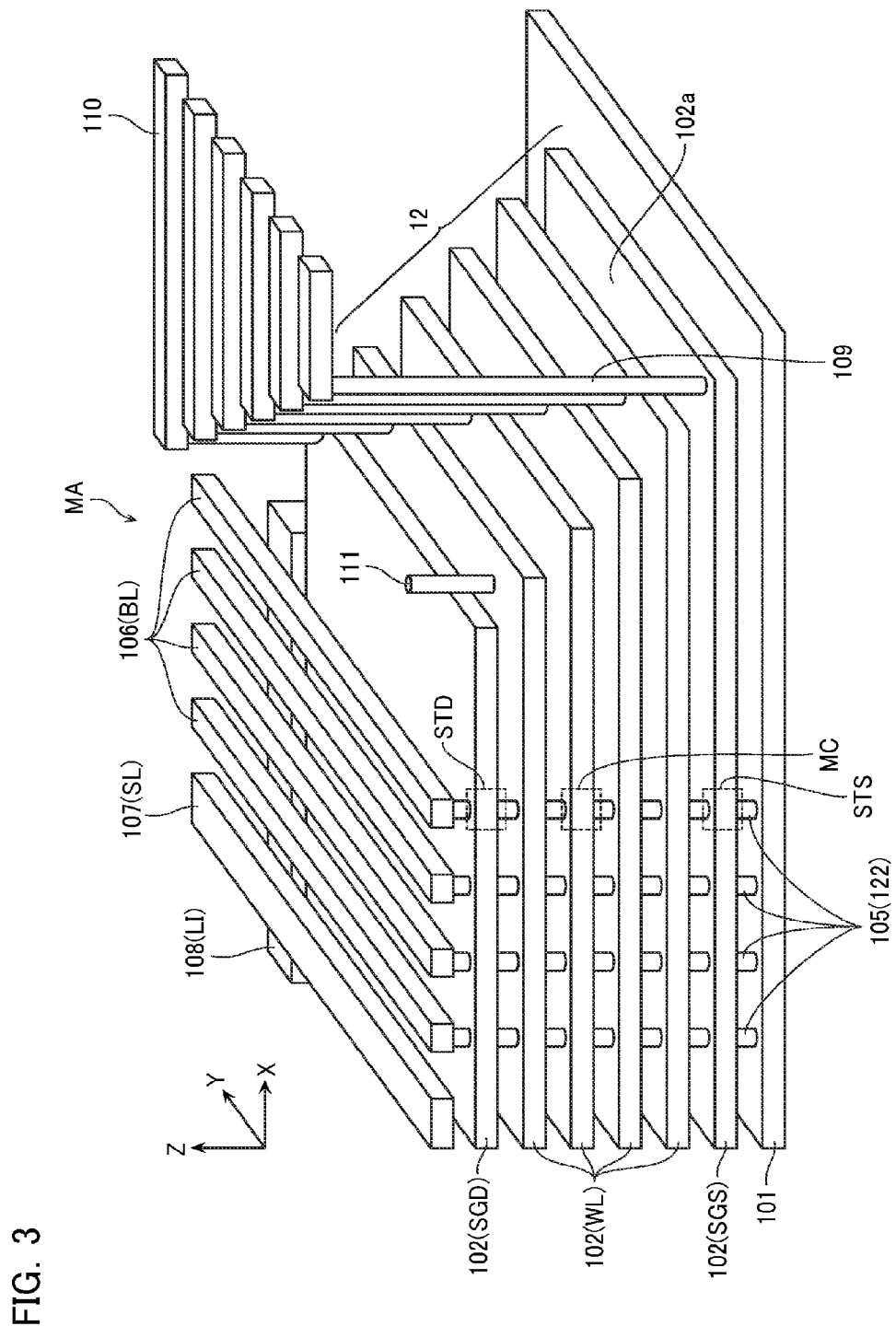
FIG. 3 is a perspective view showing a configuration of a memory cell array MA of the same semiconductor memory device.

Next, a schematic configuration of the memory cell array MA according to the present embodiment will be described with reference to FIG. 3. FIG. 3 is a schematic perspective view showing a configuration of part of the memory cell array MA. Note that in FIG. 3, part of the configuration is omitted.

As shown in FIG. 3, the memory cell array MA according to the present embodiment comprises: a substrate 101; and a plurality of conductive layers 102 stacked in a Z direction on the substrate 101. In addition, the memory cell array MA includes a plurality of memory columnar bodies 105 extending in the Z direction. As shown in FIG. 3, an intersection of the conductive layer 102 and the memory columnar body 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

As shown in FIG. 3, the plurality of conductive layers 102 are formed in a stepped shape and configure a stepped part 12 at their ends in the X direction in a contact region CR.

The stepped part 12 comprises a support column 111 extending in the Z direction to penetrate the stepped structure 12.

Disposed in the stepped part 12 is a contact 109 for electrically connecting each of layers configuring the stepped part 12 and an upper wiring line 110.

As shown in FIG. 3, disposed upwardly of the memory cell array MA are a conductive layer 106 functioning as the bit line BL and a conductive layer 107 functioning as the source line SL.

As shown in FIG. 3, the memory cell array MA comprises a conductive layer 108 that faces side surfaces in a Y direction of the plurality of conductive layers 102 and extends in the X direction. A lower surface of the conductive layer 108 contacts the substrate 101. The conductive layer 108 is configured from a conductive layer of the likes of tungsten (W), for example, and functions as the source contact LI.

Figure 4:
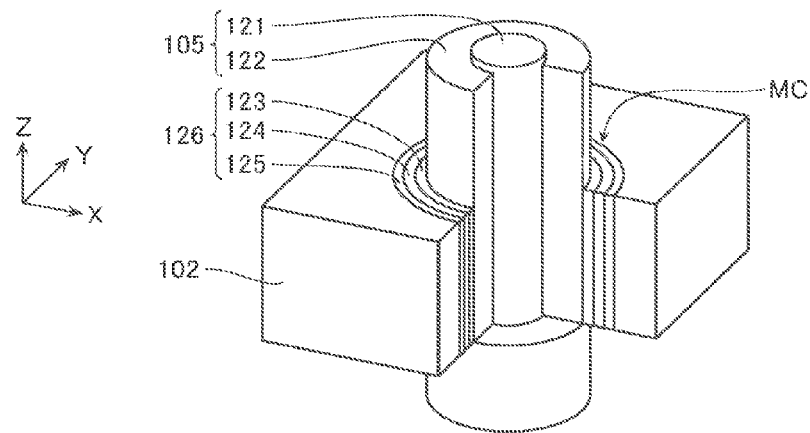
FIG. 4 is a schematic perspective cross-sectional view showing an example of configuration of one memory cell MC included in the same semiconductor memory device.

Next, a schematic configuration of the memory cell MC according to the present embodiment will be described with reference to FIG. 4. FIG. 4 is a schematic perspective view showing a configuration of the memory cell MC. Note that FIG. 4 shows the configuration of the memory cell MC, but the source side select gate transistor STS and the drain side select gate transistor STD may also be configured similarly to the memory cell MC. In FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122 covering a sidewall of the core insulating layer 121. Furthermore, a memory film 126 is provided between the semiconductor layer 122 and the conductive layer 102. The memory film 126 includes a tunnel insulating layer 123, a charge accumulation layer 124, and a block insulating layer 125.

The core insulating layer 121 is configured from an insulating layer of the likes of silicon oxide, for example. The semiconductor layer 122 is configured from a semiconductor layer of the likes of polysilicon, for example. Moreover, the semiconductor layer 122 functions as a channel of the memory cell MC, the source side select gate transistor STS, and the drain side select gate transistor STD. The tunnel insulating layer 123 is configured from an insulating layer of the likes of silicon oxide, for example. The charge accumulation layer 124 is configured from an insulating layer capable of accumulating a charge, of the likes of silicon nitride, for example. The block insulating layer 125 is configured from an insulating layer of the likes of silicon oxide, for example.

Figure 5:
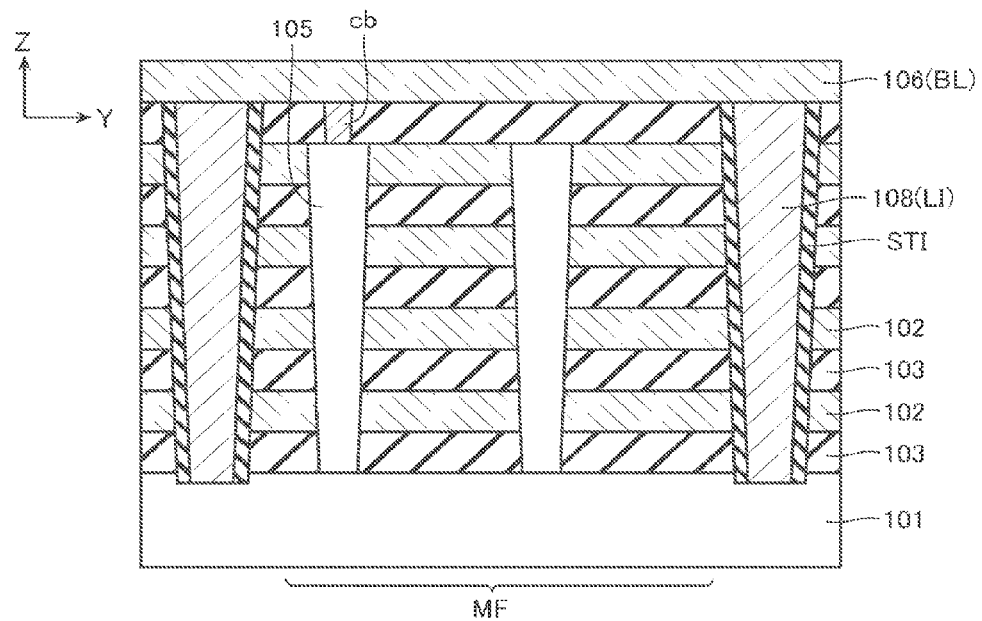
FIG. 5 is a schematic cross-sectional view showing a configuration of the same semiconductor memory device.
Figure 6:
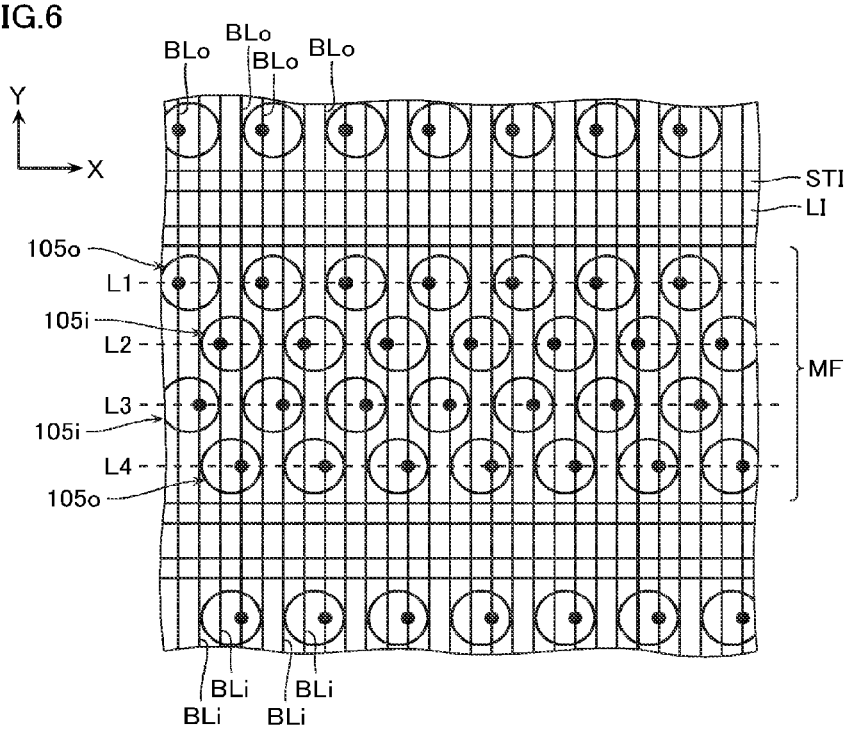
FIG. 6 is a schematic plan view showing a configuration of the same semiconductor memory device.

Next, a configuration of the semiconductor memory device according to the present embodiment will be described in more detail with reference to FIGS. 5 and 6. FIG. 5 is a cross-sectional view showing a configuration of part of the memory cell array MA; and FIG. 6 is a schematic plan view showing a configuration of the semiconductor memory device according to the present embodiment. Note that in FIGS. 5 and 6, illustration of the memory film 126 is omitted.

As shown in FIG. 5, in the present embodiment, a plurality of the conductive layers 102 are stacked in the Z direction, via an insulating layer 103, on the substrate 101. The conductive layer 102 functions as the word line WL. The memory columnar body 105 is provided extending in the Z direction such that its side surface is covered by the conductive layer 102. The memory columnar body 105 is connected to the conductive layer 106 (bit line BL) via a contact cb provided at an upper end of the memory columnar body 105.

Note that the configuration shown in FIG. 5 is provided in plurality repeatedly along the Y direction. That is, a stacked body including the plurality of conductive layers 102 stacked in the Z direction is provided in plurality repeatedly along the Y direction. This stacked body configures the previously mentioned memory finger MF.

An insulating isolation layer STI isolates between the memory fingers MF provided in plurality along the Y direction. The insulating isolation layer STI extends in the X direction and is provided on a side surface facing the stacked body, of the conductive layer 108.

Moreover, in the present embodiment, as shown in FIG. 6, in one memory finger MF, the memory columnar bodies 105 are provided along a plurality of columns (in the present embodiment, four columns of L1 to L4) that extend in the X direction and are arranged in parallel along the Y direction. Positions in the X direction, of the memory columnar bodies 105 provided in columns adjacent in the Y direction, are different. In other words, the memory columnar bodies 105 are arranged staggered so as to form a line in an oblique direction to the X direction and the Y direction. As a result, an array density of the memory columnar bodies 105 is increased, and an array density of the memory cells MC is raised. However, this is merely an example, and it is also possible to configure such that the memory columnar bodies 105 are aligned along the X direction and the Y direction.

In one memory finger MF, one bit line BL is connected to one memory columnar body 105. The bit line BL extends in the Y direction and is shared between memory fingers arranged along the Y direction. As mentioned above, in the present embodiment, an ABL (All Bit Line) system sense amplifier is employed, and a separate sense amplifier-cum-data latch 3 is connected to each bit line BL.

[Operation]

Figure 7A:
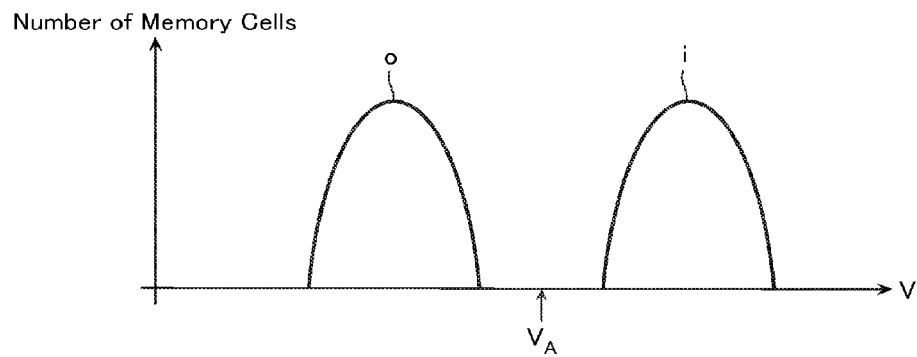
FIG. 7A is a view showing distributions of threshold voltages of the memory cell MC during read.

In the present embodiment, during read, as shown in FIG. 7A, a voltage $V_A$ is applied to the memory cell MC. Moreover, the memory cell MC whose threshold voltage is $V_A$ or less and which stores 0 data and the memory cell MC whose threshold voltage is higher than $V_A$ and which stores 1 data, are discriminated.

Figure 7B:
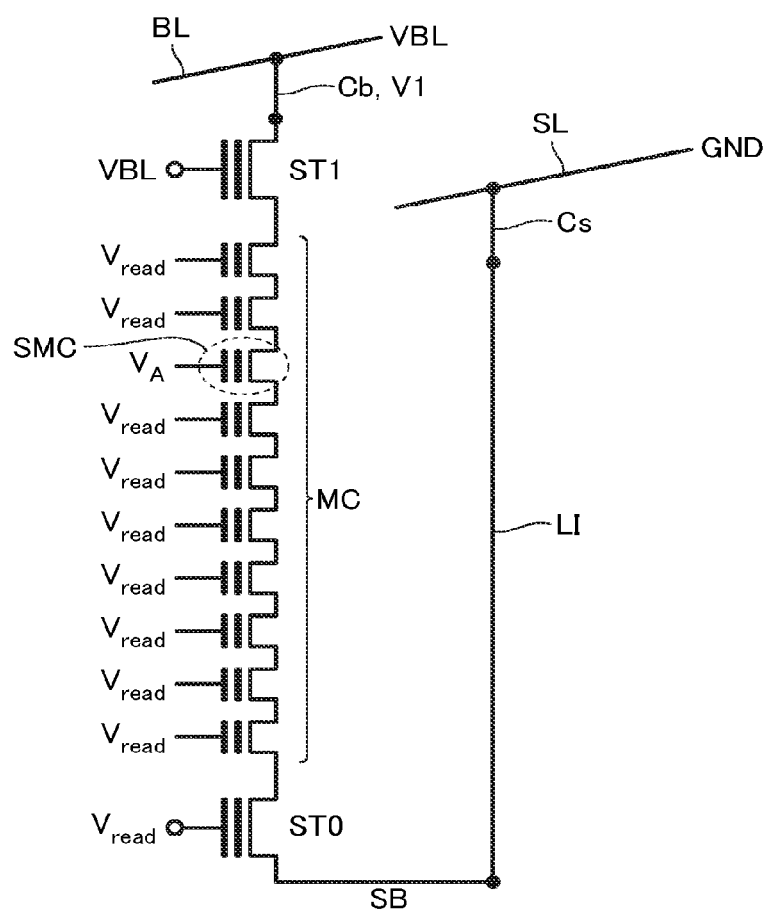
FIG. 7B is an equivalent circuit diagram showing applied voltages during read.

An equivalent circuit diagram indicating voltages applied to the memory cells MC, and so on, at this time, is shown in FIG. 7B.

As shown in FIG. 7B, the bit line BL connected to a selected memory cell SMC is provided with a bit line voltage VBL. The word line WL connected to the selected memory cell SMC is provided with the voltage $V_A$, and unselected word lines WL and the source side select gate line SGS are provided with a read voltage $V_{read}$. The drain side select gate line SGD is provided with the bit line voltage VBL. The source line SL connected to the selected memory cell SMC is provided with a ground voltage GND. Thereupon, ON/OFF of the selected memory cell SMC is switched by whether the voltage $V_A$ of the selected memory cell SMC exceeds a threshold value of the selected memory cell SMC or not. At that time, for example, the likes of whether a current flows in the bit line BL or not is detected by the sense amplifier connected to the bit line BL, and data (0 or 1) stored by the selected memory cell SMC is determined.

Figure 8A:
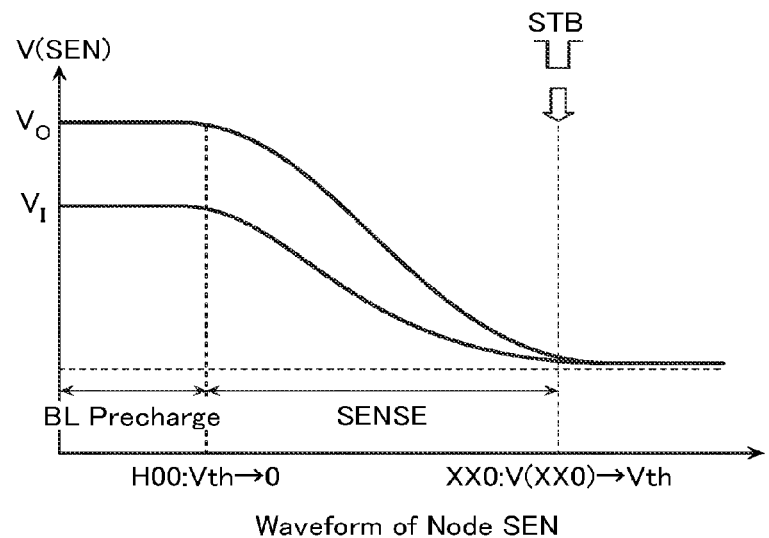
FIG. 8A is a view showing a sense node waveform during read of the same semiconductor memory device.
Figure 9:
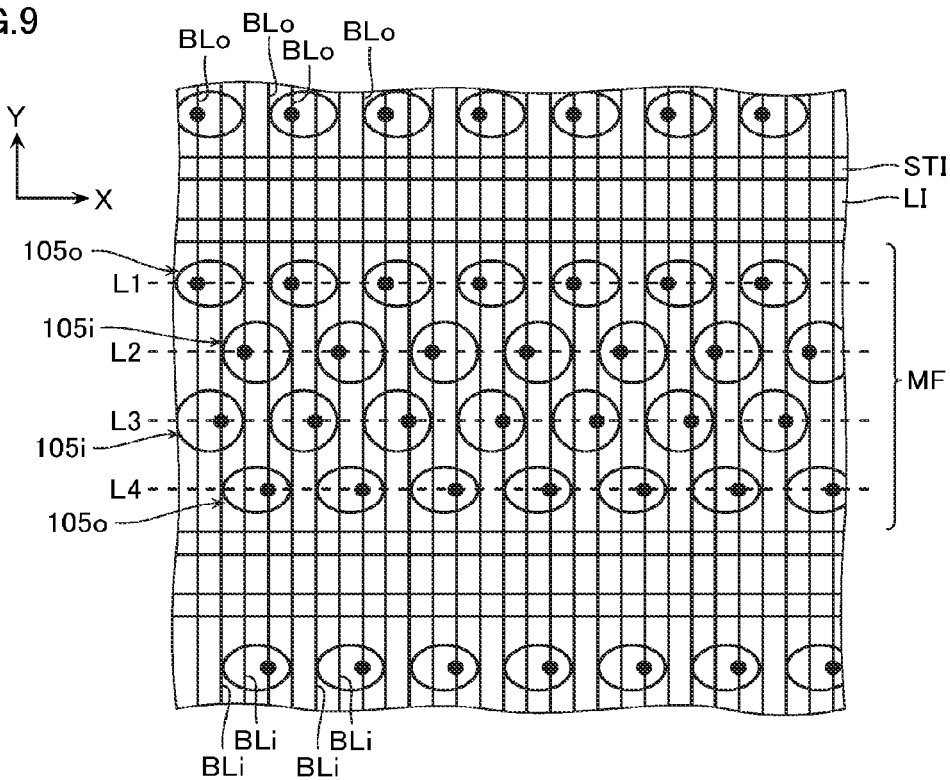
FIG. 9 is a plan view showing several examples of planar shapes of a memory columnar body of the same semiconductor memory device.

Moreover, in the present embodiment, during the read operation, outer bit lines BLo connected to memory columnar bodies 105o disposed along the columns L1 and L4 adjacent to the insulating isolation layer STI, of the plurality of columns L1 to L4 arranged in parallel along the Y direction shown in FIG. 9, are applied (pre-charged) with a first voltage Vo as shown in FIG. 8A. Moreover, bit lines BLi connected to inner memory columnar bodies 105i disposed along the columns L2 and L3 which are at positions more distant from the insulating isolation layer STI than the columns L1 and L4 adjacent to the insulating isolation layer STI are, are applied (pre-charged) with a second voltage Vi which is smaller than the first voltage Vo.

Now, in a semiconductor memory device of the kind where the insulating isolation layer STI is provided laterally of the memory finger MF, the source contact LI is implanted sandwiched by insulating isolation layers STI. Thereupon, a distance from the source contact LI differs for the memory columnar bodies 105o along the columns (outer columns) L1 and L4 adjacent to the insulating isolation layer STI and the memory columnar bodies 105i disposed in the columns L2 and L3 more to the inside than those columns L1 and L4.

Therefore, lengths of current paths of currents flowing in the memory columnar bodies 105o along the columns L1 and L4 on the outside and the memory columnar bodies 105i along the columns L2 and L3 on the inside, respectively differ and a difference in cell characteristics sometimes occurs.

In addition, a memory hole for forming the memory columnar body 105 is frequently formed as a circular pattern. However, in the columns L1 and L4 on the outside close to the insulating isolation layer STI, it sometimes becomes more difficult to keep a uniform shape overall of the memory columnar bodies 105 in the memory finger MF, such as an X-Y planar shape of the memory hole becoming misshapen from a circle during memory hole formation, compared to in the columns L2 and L3 on the inside.

Specifically, as shown in FIG. 9, for example, the X-Y planar shape of the memory columnar bodies 105o along the columns L1 and L4 on the outside sometimes attains an elliptical shape where a length in the Y direction is shorter than a length in the X direction, in other words, a shape that has become misshapen from a circle.

In this case, curvatures in an arc portion along a major axis and an arc portion along a minor axis of the ellipse are different (the arc portion along the minor axis has a larger curvature). Therefore, an electric field concentration occurs in that arc portion along the minor axis, and as a result, sometimes, a current flowing in the memory columnar body 105o on the outside ends up being consumed faster than that flowing in the memory columnar body 105i on the inside.

In other words, sometimes, as in the example shown in FIG. 9, the memory columnar body 105o on the outside has a planar shape including a portion whose curvature change is larger than that of the planar shape of the memory columnar body 105i on the inside. In such a case, an electric field concentration occurs in that portion where curvature change is large, and there is a possibility that the current flowing in the memory columnar body 105o on the outside ends up being consumed faster than that flowing in the memory columnar body 105i on the inside.

For the above kinds of reasons, in the present embodiment, as shown in FIG. 8A, the voltage Vo applied to the memory columnar body 105o on the outside during the read operation is set to a higher value than that of the voltage Vi applied to the memory columnar body 105i on the inside. By setting in this way, as shown in FIG. 8A, even if the current flowing in the memory columnar body 105o on the outside flows faster than the current flowing in the memory columnar body 105i on the inside, timings at which they (the voltages Vo and Vi) reach a level detectable by the sense amplifier end up the same, hence it becomes possible to suppress variation in cell characteristics caused by variation in shape of the memory columnar body 105o on the outside.

Note that in the present embodiment, an elliptical shape has been given as an example of the planar shape of the memory columnar body 105o on the outside. However, even when the memory columnar body 105o on the outside has a planar shape including an acute-angled portion where an electric field concentration easily occurs, such as a polygonal shape, other than an elliptical shape, it sometimes ends up being easier for a current to flow therein than in the memory columnar body 105i on the inside, and the present embodiment can be applied.

Second Embodiment

The above embodiment described an example where the current flowing in the memory columnar body 105o on the outside flows faster than the current flowing in the memory columnar body 105i on the inside. However, in a second embodiment, contrary to in the first embodiment, the current flowing in the memory columnar body 105i on the inside flows faster than the current flowing in the memory columnar body 105o on the outside.

In this regard, when, for example, as shown in FIG. 9, the X-Y planar shape of the memory columnar bodies 105o along the columns L1 and L4 on the outside attains an elliptical shape where a length in the Y direction is shorter than a length in the X direction, in other words, a shape that has become misshapen from a circle, the length in the Y direction of the memory columnar body 105o on the outside is shorter than the length in the Y direction of the memory columnar body 105i on the inside. Therefore, deposition of a semiconductor layer 122o decreases accordingly, and resistance sometimes increases. Moreover, the path of current flowing in the memory columnar body 105o on the outside becomes longer than the path of current flowing in the memory columnar body 105i on the inside, hence resistance sometimes increases accordingly.

If these increments of resistance become larger than an effect of electric field concentration occurring in the arc portion along the minor axis (portion where curvature is large) of the memory columnar body 105o on the outside, then, as described above, the current flowing in the memory columnar body 105*i* on the inside flows faster than the current flowing in the memory columnar body 105*o* on the outside.

Figure 8B:
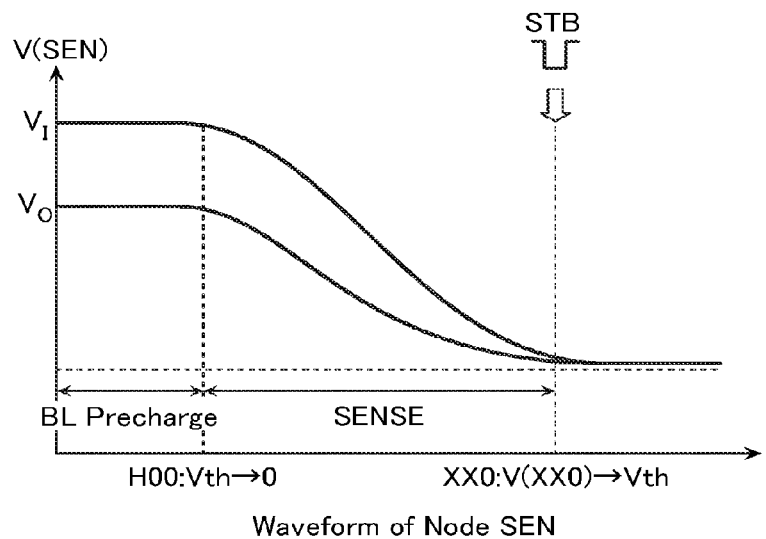
FIG. 8B is a view showing a sense node waveform during read of a semiconductor memory device according to a second embodiment.

Therefore, in such a case, as shown in FIG. 8B and contrary to in FIG. 8A, the voltage Vo applied to the memory columnar body 105*o* on the outside during the read operation is set to a smaller value than that of the voltage Vi applied to the memory columnar body 105*i* on the inside. By setting in this way, as shown in FIG. 8B, even if the current flowing in the memory columnar body 105*i* on the inside flows faster than the current flowing in the memory columnar body 105*o* on the outside, timings at which they (the voltages Vo and Vi) reach a level detectable by the sense amplifier end up the same, hence it becomes possible to suppress variation in cell characteristics caused by variation in shape of the memory columnar body 105*o* on the outside.

MODIFIED EXAMPLES

Figure 10:
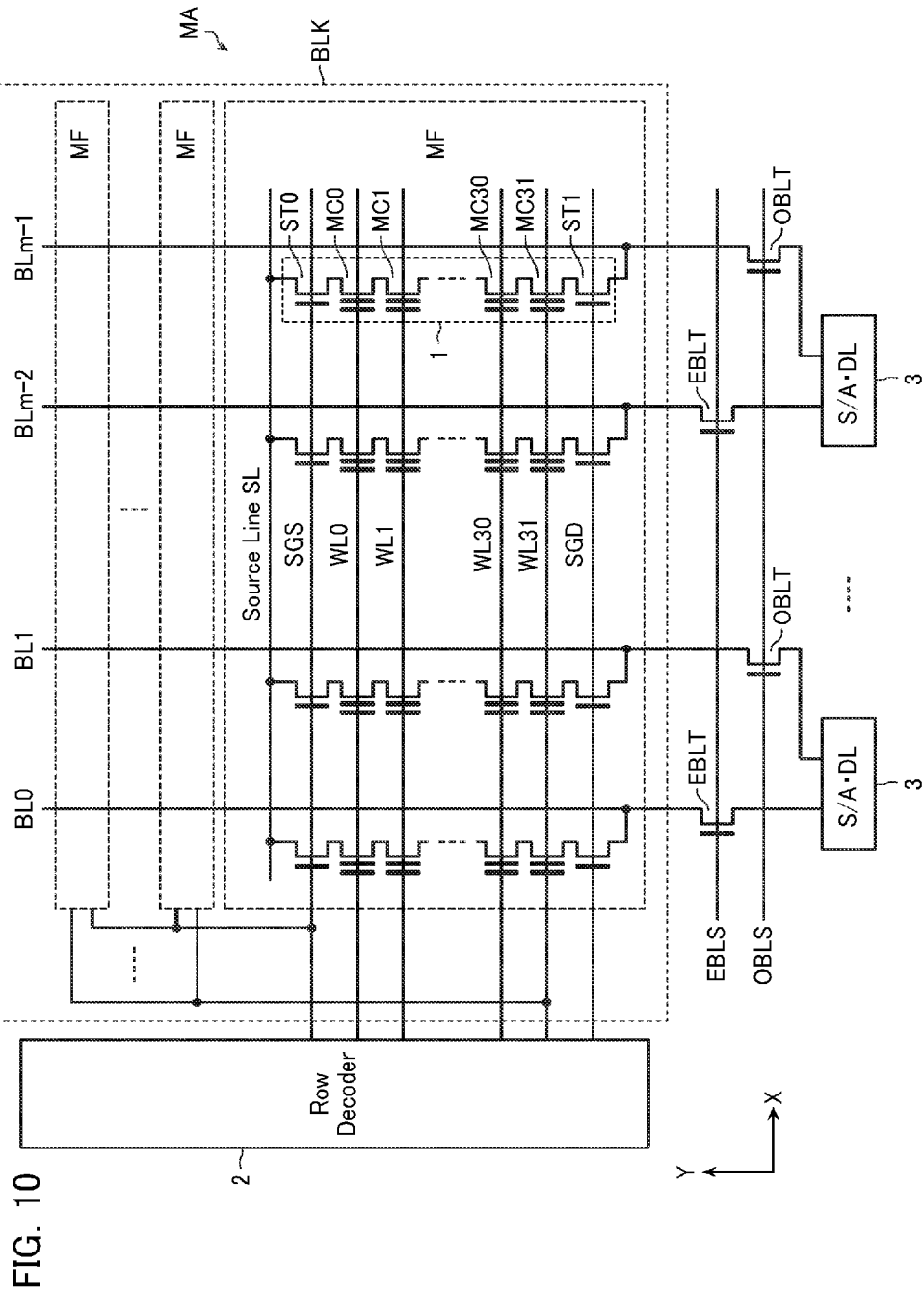
FIG. 10 is an equivalent circuit diagram showing a read circuit of a semiconductor memory device according to a modified example.

The above embodiments described ABL (All Bit Line) where a separate sense amplifier is connected to each bit line BL. However, as shown in FIG. 10, it is also possible to adopt an odd/even system (Even/Odd method) where pairs of even-numbered bit lines BL0, BL2, . . . and odd-numbered bit lines BL1, BL3, are each connected to one sense amplifier-cum-data latch 3 and the odd-numbered bit lines and even-numbered bit lines are read alternately. Now, the even-numbered bit lines BL0, BL2, . . . and the sense amplifier-cum-data latch 3 are connected via an even-numbered bit line select transistor EBLT. The even-numbered bit line select transistor EBLT is on/off-controlled by an even-numbered bit line select line EBLS. The odd-numbered bit lines BL1, BL3, and the sense amplifier-cum-data latch 3 are connected via an odd-numbered bit line select transistor OBLT. The odd-numbered bit line select transistor OBLT is on/off-controlled by an odd-numbered bit line select line OBLS. Moreover, the sense amplifier-cum-data latch 3 in the odd/even system detects a voltage of the bit line BL.

By, for example, setting the odd-numbered bit line as the bit line BLo connected to the memory columnar body 105*o* on the outside in FIG. 6, setting the even-numbered bit line as the bit line BLi connected to the memory columnar body 105*i* on the inside in FIG. 6, and adjusting voltages applied to each of the bit lines, it is possible to suppress deterioration of cell characteristics caused by variation in shape, and so on, of the memory columnar body 105, similarly to in the first embodiment, even when this odd/even system is adopted.

In addition, the above embodiments described an example of the read operation. However, the same applies also during a verify read operation.

Figure 11A:
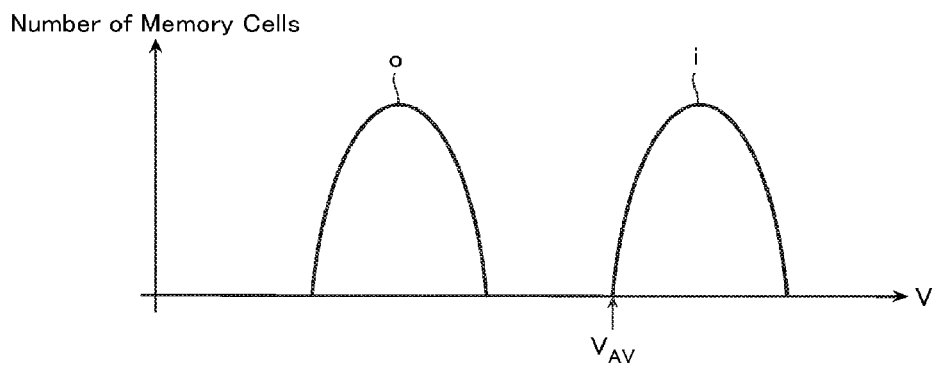
FIG. 11A is a view showing threshold distributions of a memory cell MC during verify read.

The verify read operation is similar to the read operation except for a voltage value applied to the selected memory cell. Specifically, as shown in FIG. 11A, a verify read voltage $V_{AV}$ has a value close to a lower limit value of a memory cell MC storing 1 data.

Figure 11B:
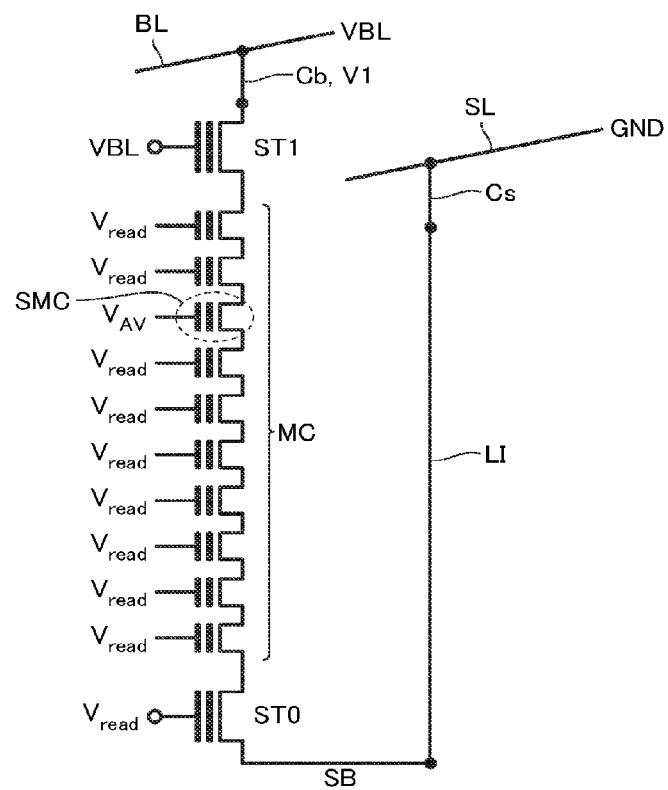
FIG. 11B is an equivalent circuit diagram showing applied voltages during verify read.

At this time, the voltages applied are as in FIG. 11B. This has the applied voltage of the selected memory cell SMC changed to $V_{AV}$ in the applied voltages during the read operation described in FIG. 7B.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of stacked bodies, one of the stacked bodies including a plurality of control gate electrodes stacked in a first direction, the stacked bodies extending in a second direction intersecting the first direction;
    an insulating isolation layer disposed between a pair of the stacked bodies adjacent in a third direction intersecting the first direction and the second direction, the insulating isolation layer extending in the second direction;
    a plurality of semiconductor layers, one of the semiconductor layers extending in the first direction and having its side surface covered by the plurality of control gate electrodes, the semiconductor layers being disposed in a plurality of columns in one of the plurality of stacked bodies;
    a memory cell disposed between one of the control gate electrode and one of the semiconductor layer, the memory cell including a charge accumulation layer;
    a plurality of bit lines connected to one end of the semiconductor layers, the bit lines extending in the third direction; and
    a control circuit being configured to control the control gate electrodes and the bit lines,
    the control circuit, during a read operation, being configured to apply a first voltage to a first bit line connected to the semiconductor layer positioned in a first column of the plurality of columns, thereby reading a first one of the memory cells connected to the first bit line, and apply a second voltage different from the first voltage to a second bit line connected to the semiconductor layer positioned in a second column which is at a position more distant from the insulating isolation layer than the first column is, thereby reading a second one of the memory cells connected to the second bit line.

2. The semiconductor memory device according to claim 1, wherein
    the second voltage is smaller than the first voltage.

3. The semiconductor memory device according to claim 1, wherein
    the second voltage is larger than the first voltage.

4. The semiconductor memory device according to claim 1, wherein
    a width in a cross section along the second direction or the third direction of the semiconductor layer positioned in the first column is different from a width of a cross section along the second direction or the third direction of the semiconductor layer positioned in the second column.

5. The semiconductor memory device according to claim 1, wherein
    a position in the second direction of the semiconductor layer positioned in the first column is different from a position in the second direction of the semiconductor layer positioned in the second column.

6. The semiconductor memory device according to claim 1, wherein
    the insulating isolation layer is disposed at both ends of the stacked body,
    the first column is a column adjacent to the insulating isolation layer, of the plurality of columns, and the second column is a column other than the first column, of the plurality of columns.

7. The semiconductor memory device according to claim 1, further comprising
a plurality of sense amplifiers being configured to detect a current flowing in the bit line during the read operation,
wherein the plurality of bit lines are each connected to a separate sense amplifier.

8. The semiconductor memory device according to claim 1, further comprising
a plurality of sense amplifiers being configured to detect a voltage of the bit line during the read operation,
wherein a pair of the bit lines adjacent in the second direction is connected to one of the sense amplifiers.

9. The semiconductor memory device according to claim 1, wherein
the read operation is a verify read operation.

\* \* \* \* \*